US008507987B2

(12) United States Patent
Huang et al.

(10) Patent No.: US 8,507,987 B2
(45) Date of Patent: Aug. 13, 2013

(54) RADIO FREQUENCY DEVICE AND METHOD FOR FABRICATING THE SAME

(75) Inventors: Sheng-Yi Huang, Hsinchu (TW); Cheng-Chou Hung, Hsinchu (TW); Tzung-Lin Li, Pingtung (TW); Chin-Lan Tseng, Miaoli (TW); Victor-Chiang Liang, Hsinchu (TW); Chih-Yu Tseng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 993 days.

(21) Appl. No.: 12/563,434

(22) Filed: Sep. 21, 2009

(65) Prior Publication Data

US 2011/0068415 A1 Mar. 24, 2011

(51) Int. Cl.
*H01L 29/66* (2006.01)
*H01L 21/336* (2006.01)

(52) U.S. Cl.
USPC .... 257/343; 257/344; 257/408; 257/E29.266; 438/279; 438/286

(58) Field of Classification Search
CPC ............... H01L 21/823425; H01L 21/823437; H01L 21/823456; H01L 29/6656; H01L 29/7833; H01L 29/6659
USPC ......... 257/341, 351, 343, 344, 408, E21.437, 257/E29.266; 438/279, 286
See application file for complete search history.

(56) References Cited

U.S. PATENT DOCUMENTS

| | | | | |
|---|---|---|---|---|
| 7,323,740 | B2 | 1/2008 | Park et al. | |
| 2003/0122192 | A1 * | 7/2003 | Ker et al. | 257/347 |
| 2007/0290266 | A1 * | 12/2007 | Ker et al. | 257/355 |
| 2008/0203424 | A1 * | 8/2008 | Chen et al. | 257/102 |

* cited by examiner

*Primary Examiner* — Kenneth Parker
*Assistant Examiner* — Jose R Diaz
(74) *Attorney, Agent, or Firm* — Ding Yu Tan

(57) ABSTRACT

A radio frequency (RF) device that can achieve high frequency response while maintaining high output impedance and high breakdown voltage includes a substrate, a gate, at least a dummy gate, at least a doped region, a source region and a drain region. The substrate includes a well of first type and a well of second type. The well of second type is adjacent to the well of first type.

19 Claims, 15 Drawing Sheets

206 208 209 209 209 209 212 210 214 200 204 202

RADIO FREQUENCY DEVICE AND METHOD FOR FABRICATING THE SAME

BACKGROUND

1. Field of the Invention

The present invention generally relates to a radio frequency (RF) device and particularly to a radio frequency device that can achieve high frequency response while maintaining high output impedance and high breakdown voltage.

2. Description of the Related Art

In order to meet the increasing popularity of various wireless communication applications, demands for high-voltage radio frequency devices with high frequency response have correspondingly rapidly increased. Accordingly, with regard to the demands for high-voltage radio frequency devices, achieving high frequency response while maintaining high output impedance and high breakdown voltage is very important. Although conventional asymmetric high-voltage radio frequency devices can achieve high output impedance and high breakdown voltage, the frequency response could not be effectively improved.

Referring to FIG. 1, a conventional high-voltage radio frequency device as illustrated in FIG. 1 primarily includes a semiconductor substrate 100, an n-type doped well 102, a p-type doped region 104, a p-type buried doped region 106, a gate 108, an n-type source region 110 and an n-type drain region 112. The gate 108 includes a gate electrode and a gate dielectric layer (not labeled). The n-type doped well 102 is formed in a surface of the semiconductor substrate 100. The buried doped region 106 is formed in the surface of the semiconductor substrate 100 and adjacent to the n-type doped well 102. The gate 108 is directly formed on the semiconductor substrate 100 and crossing over an interface of the n-type doped well 102 and the buried doped region 106. The n-type source region 110 is formed on a surface of the buried doped region 106 and at a side of the gate 108. The n-type source region 110 and the n-type doped well 102 are isolated from each other by the buried doped region 106. The p-type doped region 104 is formed on the surface of the buried doped region 106 and at a side of the n-type source region 110 far away from the gate 108. The buried doped region 104 can be connected or disconnected to the n-type source region 110. The n-type drain region 112 is formed in a surface of the n-type doped well 102 and at another side of the gate 108.

However, although the above-mentioned high-voltage radio frequency device can effectively improve the output impedance and breakdown voltage, since an area occupied by the gate is excessively large, it could not effectively improve frequency response.

BRIEF SUMMARY

It is to be understood that both the foregoing general description and the following detailed description are exemplary, and are intended to provide further explanation of the invention as claimed.

A radio frequency device in accordance with an embodiment of the present invention includes a substrate, a gate of first type formed over the substrate, a dummy gate of first type formed on the substrate, a doped region of first type, a source region of first type and a drain region of first type. The substrate includes a well of first type and a well of second type. The well of second type is adjacent to the well of first type. The gate of first type is formed over the well of second type. The dummy gate of first type is formed over the well of first type. The drain region of first type is formed in the well of first type and adjacent to the dummy gate of the first type. The source region of first type is formed in the well of second type and adjacent to the gate of first type. The doped region of first type is formed in the well of first type and adjacent to the well of second type.

A radio frequency device in accordance with another embodiment of the present invention includes a substrate, a gate of first type formed over the substrate, multiple dummy gates formed over the substrate, multiple doped regions, a source region of first type and a drain region of first type. The substrate includes a well of first type and a well of second type. The well of second type is adjacent to the well of first well. The gate of first type is formed over the well of second type. The dummy gates are formed over the well of first type. The drain region of first type is formed in the well of first type and adjacent to one of the dummy gates far away from the gate of first type. The source region of first type is formed in the well of second type and adjacent to the gate of first type. The doped regions are formed in the well of first type and between the source region of first type and the drain region of first type.

A method for fabricating a radio frequency device in accordance with an embodiment of the present invention includes: providing a substrate including a well of first type and a well of second type therein, wherein the well of first type and the well of second type are formed adjacent to each other; and forming a dummy gate of first type over the well of first type, and a gate of first type over the well of second type.

A method for fabricating a radio frequency device in accordance with another embodiment of the present invention includes: providing a substrate including a well of first type and a well of second type therein, wherein the well of first type and the well of second type are formed adjacent to each other; and forming a plurality of dummy gates over the well of first type, and a gate of first type over the well of second type.

In the respective above-mentioned embodiments of the present invention, the dummy gate(s) is/are simultaneously formed with the gate in the same process. A material of the dummy gate(s) can be poly-silicon or metal, but not limited to these examples. A process for fabricating the dummy gate(s) can be chemical vapor deposition, metal sputtering, electroplating or other suitable process.

In the respective above-mentioned embodiments of the present invention, the radio frequency device can be n-type metal-oxide-semiconductor (MOS) or p-type MOS. When the radio frequency device is n-type MOS, the first type is n-type and the second type is p-type. Whereas when the radio frequency device is p-type MOS, the first type is p-type and the second type is n-type.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
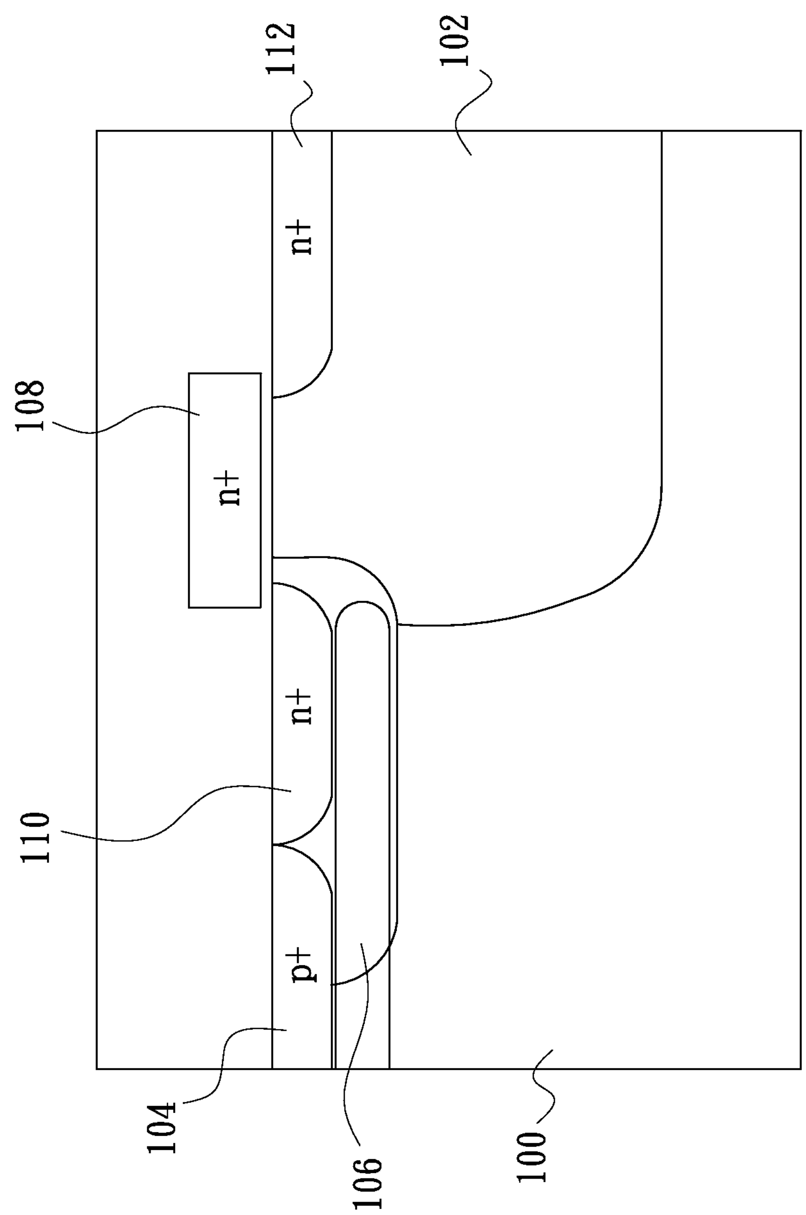
FIG. 1 is a schematic sectional view of a conventional high-voltage radio frequency device associated with the prior art.

Reference will now be made in detail to the present preferred embodiments of the invention, examples of which are illustrated in the accompanying drawings. Wherever possible, the same reference numbers are used in the drawings and the description to refer to the same or like parts.

Figure 2:
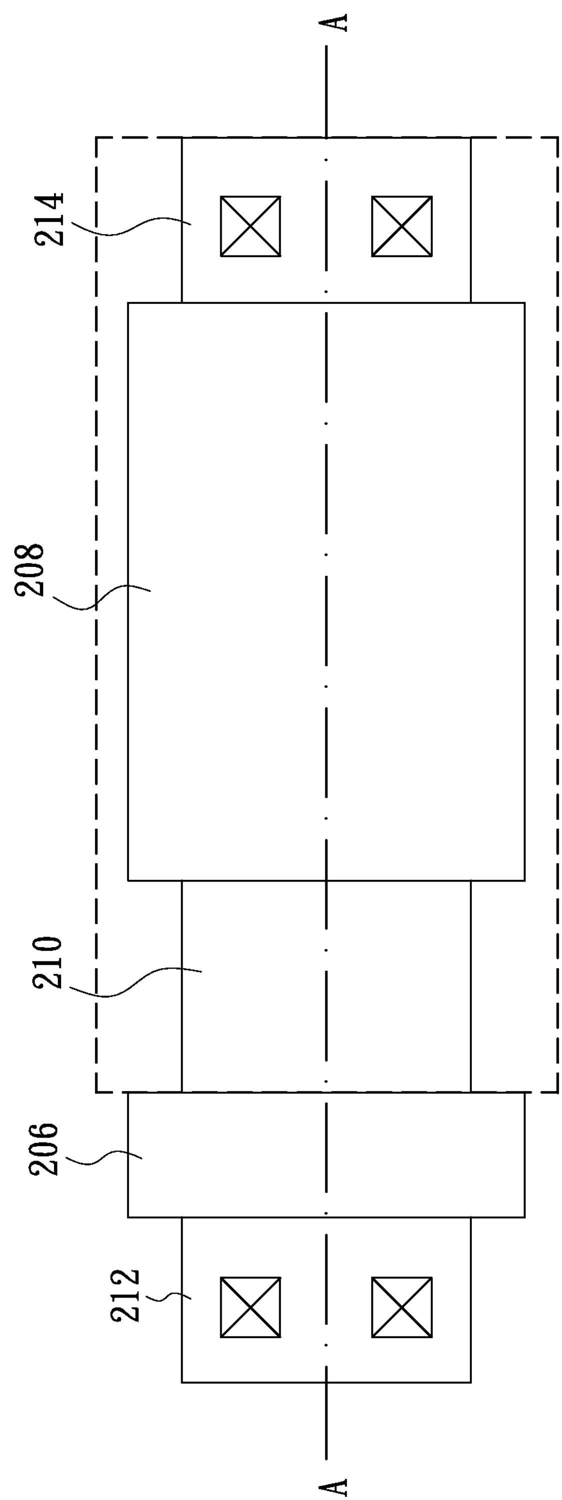
FIG. 2 is a schematic top view of a radio frequency device in accordance with a preferred embodiment of the present invention.

FIG. 2 is a schematic top view of a radio frequency device in accordance with a preferred embodiment of the present invention.

Figure 3:
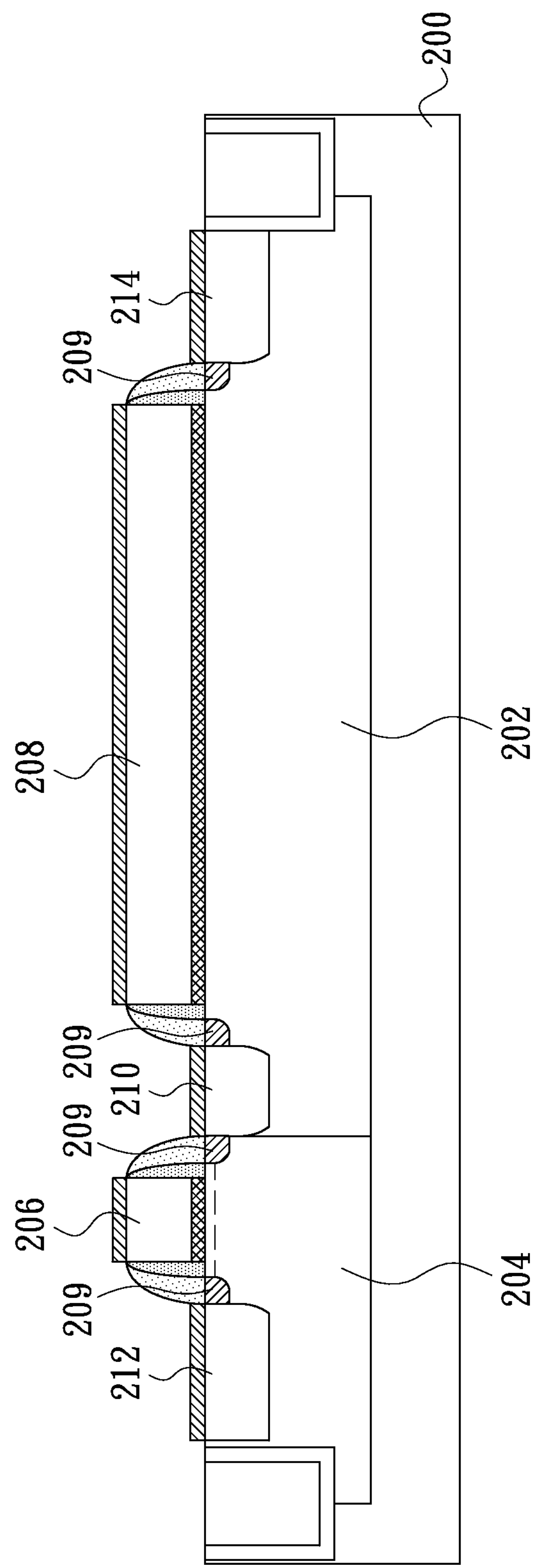
FIG. 3 illustrates a schematic sectional view of the radio frequency device taken along line A-A in FIG. 2.

Referring to FIG. 3, FIG. 3 illustrating a schematic sectional view of the radio frequency device taken along line A-A in FIG. 2. As illustrated in FIGS. 2 and 3, the radio frequency device includes a substrate 200, a gate of first type 206, a dummy gate of first type 208, a doped region of first type 210, a source region of first type 212 and a drain region of first type 214. The substrate 200 includes a well of first type 202 and a well of second type 204. The well of second type 204 is adjacent to the well of first type 202. The gate of first type 206 includes a gate electrode and a gate dielectric layer (not labeled). The dummy gate of first type 208 includes a dummy gate electrode and a gate dielectric layer (not labeled).

The gate of first type 206 is formed over the well of second type 204. The dummy gate of first type 208 is formed over the well of first type 202. The drain region of first type 214 is formed in the well of first type 202 and adjacent to the dummy gate of first type 208. The source region of first type 212 is formed in the well of second type 204 and adjacent to the gate of first type 206. The doped region of first type 210 is formed in the well of first type 202 and adjacent to the well of second type 204.

The first type for example is n-type, and the second type for example is p-type. Moreover, a width of the doped region of first type 210 for example is greater than 160 nanometers (nm), and a width of the dummy gate of first type 208 for example is greater than 90 nm. In addition, the radio frequency device for example further includes a plurality of low-doped drain (LDD) structures 209. The LDD structures 209 are formed in the substrate 200 and at two sides of the gate of first type 206 and the dummy gate of first type 208 respectively.

Figure 4:
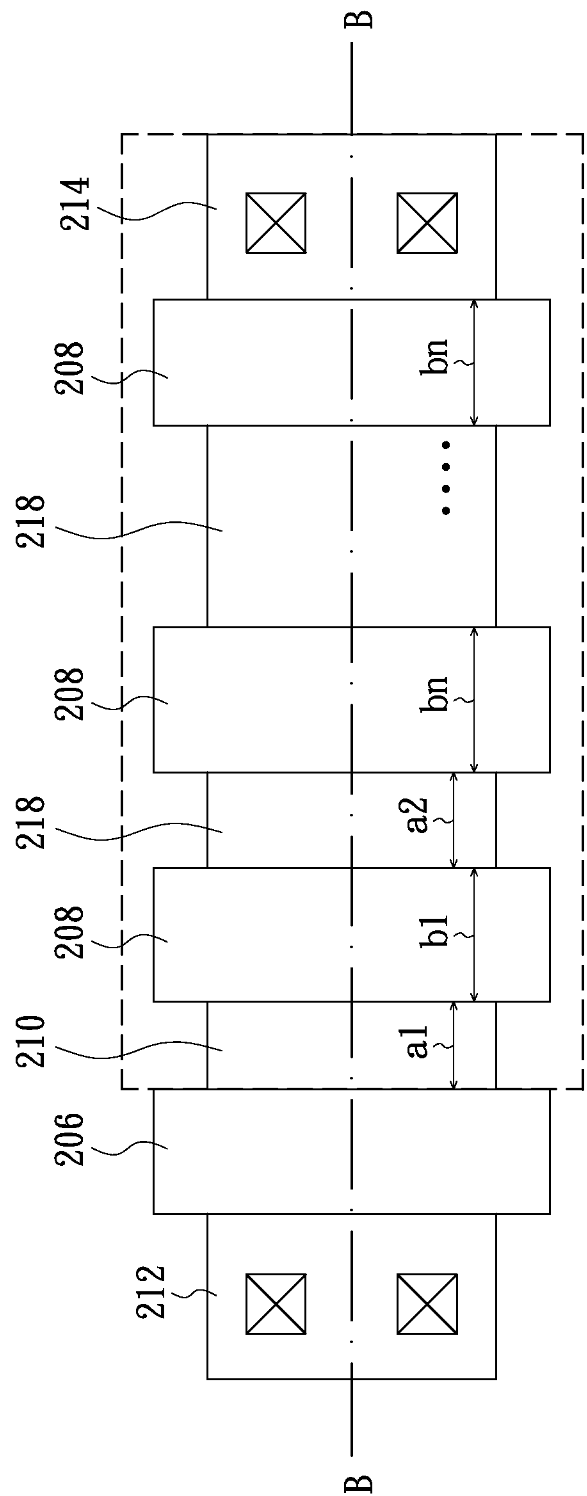
FIG. 4 is a schematic top view of a radio frequency device in accordance with another embodiment of the present invention.

FIG. 4 is a schematic top view of a radio frequency device in accordance with another embodiment of the present invention.

Figure 5:
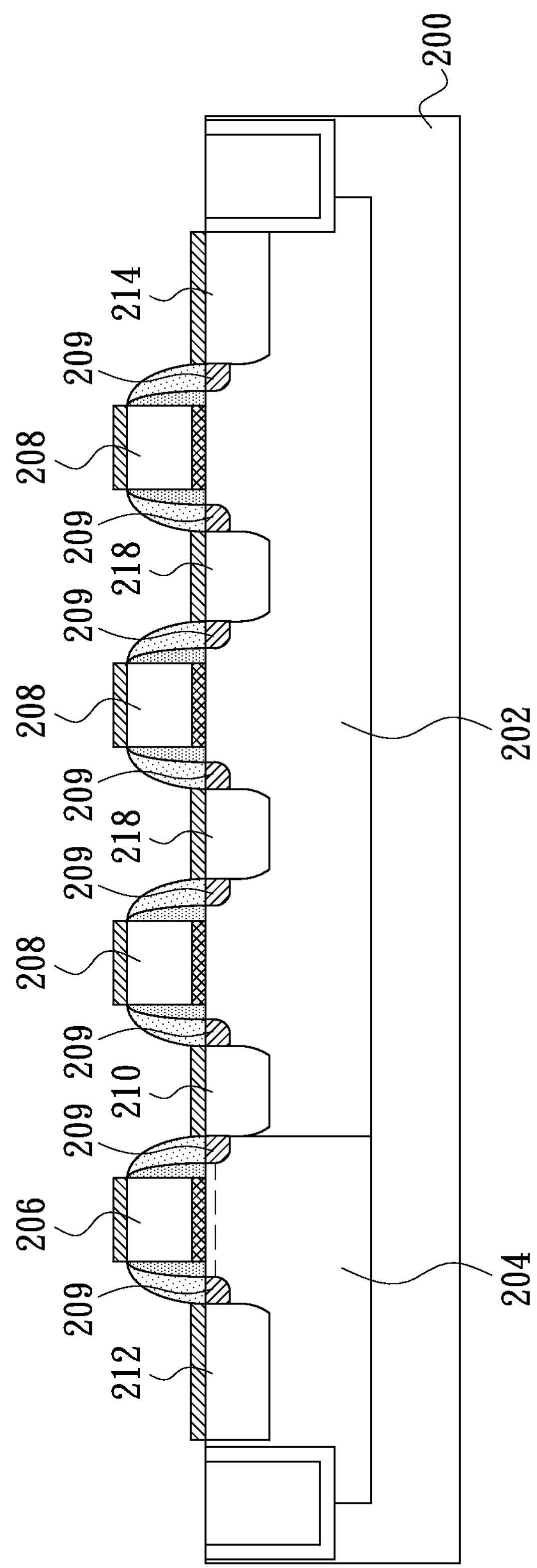
FIG. 5 illustrates a schematic sectional view of the radio frequency device taken along line B-B in FIG. 4.

Referring to FIG. 5, FIG. 5 illustrating a schematic sectional view of the radio frequency device taken along line B-B in FIG. 4. As illustrated in FIGS. 4 and 5, the radio frequency device includes a substrate 200, a gate of first type 206, a plurality of dummy gates 208, a plurality of doped regions 210, 218, a source region of first type 212 and a drain region of first type 214. The substrate 200 includes a well of first type 202 and a well of second type 204. The well of second type 204 is adjacent to the well of first type 202. The gate of first type 206 includes a gate electrode and a gate dielectric layer (not labeled), each of the dummy gates 208 includes a dummy gate electrode and a gate dielectric layer (not labeled).

The gate of first type 206 is formed over the well of second type 204 and between the source region of first type 212 and the doped region 210. The dummy gates 208 are formed over the well of first type 202 and between the drain region of first type 214 and the doped region 210. The doped regions 218 are formed in the well of first type 202 and between the respective dummy gates 208. The drain region of first type 214 is formed in the well of first type 202 at a side far away from the well of second type 204. The source region of first type 212 is formed in the well of second type 204 at a side far away from the well of first type 202. The doped region 210 is formed in the well of first type 202 at a side adjacent to the well of second type 204.

The first type for example is n-type, and the second type for example is p-type. The doped regions 210, 218 for example all are n-type doped regions or p-type doped regions. The dummy gates 208 can be n-type dummy gates, p-type dummy gates or combinations thereof. Moreover, a width of each of the doped regions 210, 218 for example is greater than 160 nm, and a width of each of the dummy gates 208 for example is greater than 90 nm. In addition, the radio frequency device for example further includes a plurality of LDD structures 209. The LDD structures 209 are formed in the substrate 200 and at two sides of the gate of first type 206 and the dummy gates 208.

Figure 6:
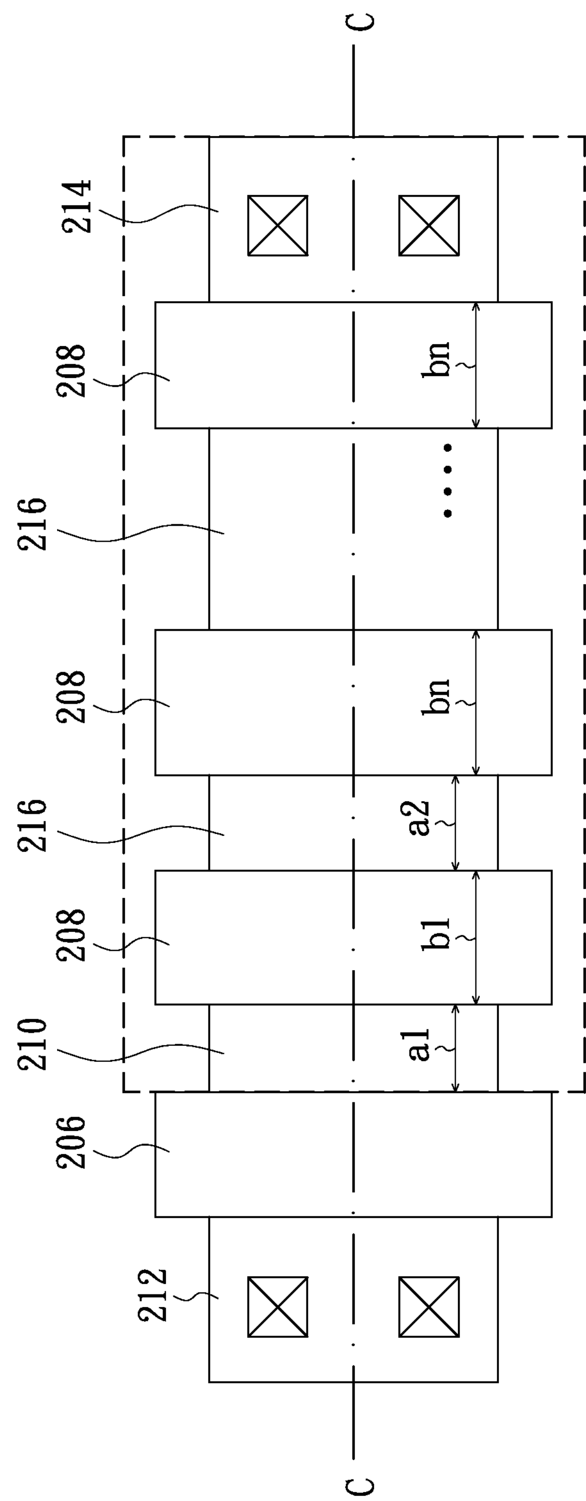
FIG. 6 is a schematic top view of a radio frequency device in accordance with still another embodiment of the present invention.

FIG. 6 is a schematic top view of a radio frequency device in accordance with still another embodiment of the present invention.

Figure 7:
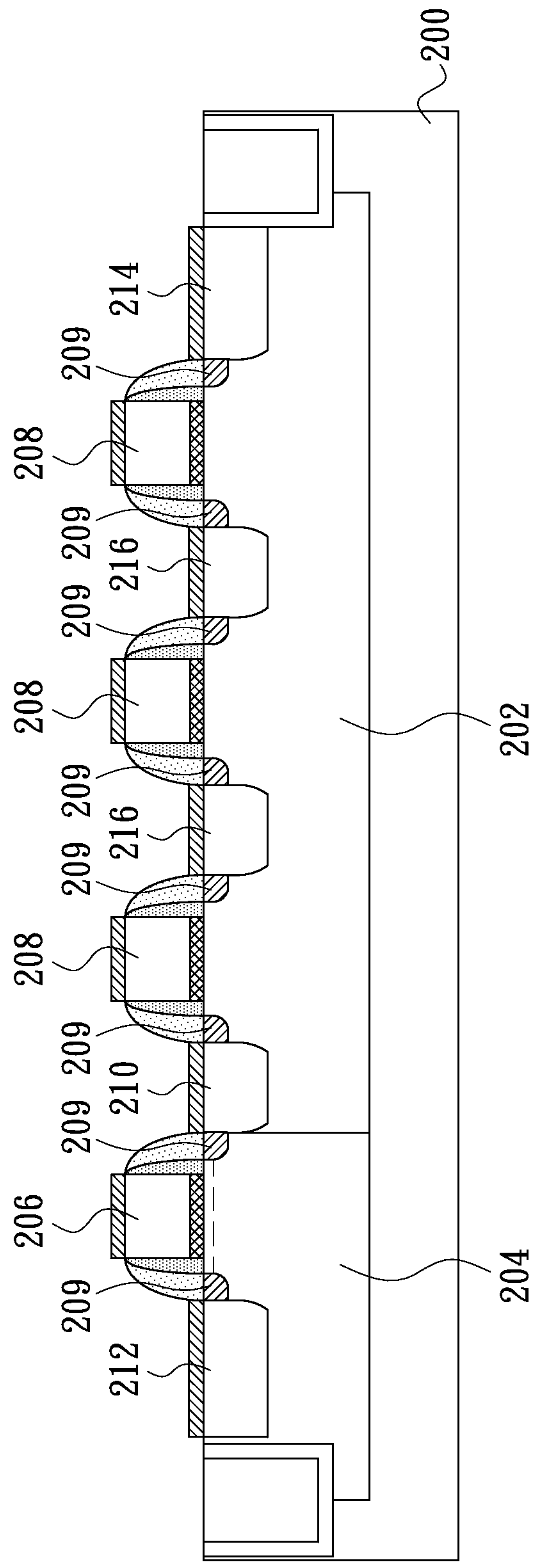
FIG. 7 illustrates a schematic sectional view of the radio frequency device taken along line C-C in FIG. 6.

Referring to FIG. 7, FIG. 7 illustrating a schematic sectional view of the radio frequency device taken along line C-C in FIG. 6. As illustrated in FIGS. 6 and 7, the radio frequency device includes a substrate 200, a gate of first type 206, a plurality of dummy gates 208, a plurality of doped regions 210, 216, a source region of first type 212 and a drain region of first type 214. The substrate 200 includes a well of first type 202 and a well of second type 204. The well of second type 204 is adjacent to the well of first type 202. The gate of first type 206 includes a gate electrode and a gate dielectric layer (not labeled), each of the dummy gates 208 includes a dummy gate electrode and a gate dielectric layer (not labeled).

The gate of first type 206 is formed over the well of second type 204 and between the source region of first type 212 and the doped region 210. The dummy gates 208 are formed over the well of first type 202 and between the drain region of first type 214 and the doped region 210. The doped regions 216 are formed in the well of first type 202 and between the respective dummy gates 208. The drain region of first type 214 is formed in the well of first type 202 at a side far away from the well of second type 204. The source region of first type 212 is formed in the well of second type 204 at a side far away from the well of first type 202. The doped region 210 is formed in the well of first type 202 at a side adjacent to well of second type 204.

The first type for example is n-type, and the second type for example is p-type. The doped regions 210, 216 are different types of doped regions. For example, the doped region 210 is n-type doped region, the doped regions 216 are p-type doped regions; or the doped region 210 is p-type doped region, the doped regions 216 are n-type doped regions. The dummy gates 208 can be n-type dummy gates, p-type dummy gates or combinations thereof. Moreover, a width of each of the doped regions 210, 216 for example is greater than 160 nm, and a width of each of the dummy gates 208 for example is greater than 90 nm. In addition, the radio frequency device for example further includes a plurality of LDD structures 209.

The LDD structures 209 are formed in the substrate 200 and at two sides of the gate of first type 206 and the dummy gates 208.

Figure 8A:
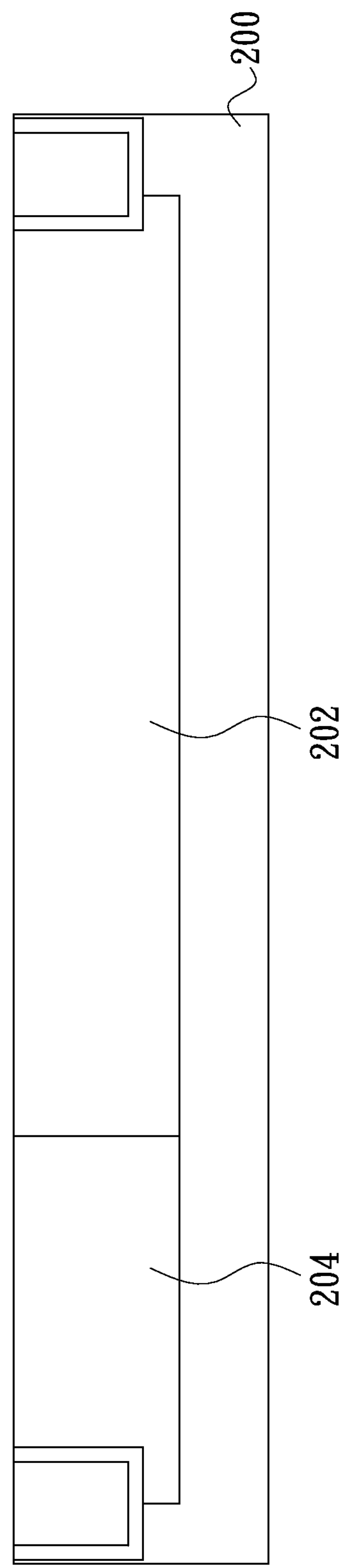
FIGS. 8A-8D are flowcharts of a method for fabricating a radio frequency device in accordance with an embodiment of the present invention.
Figure 8B:
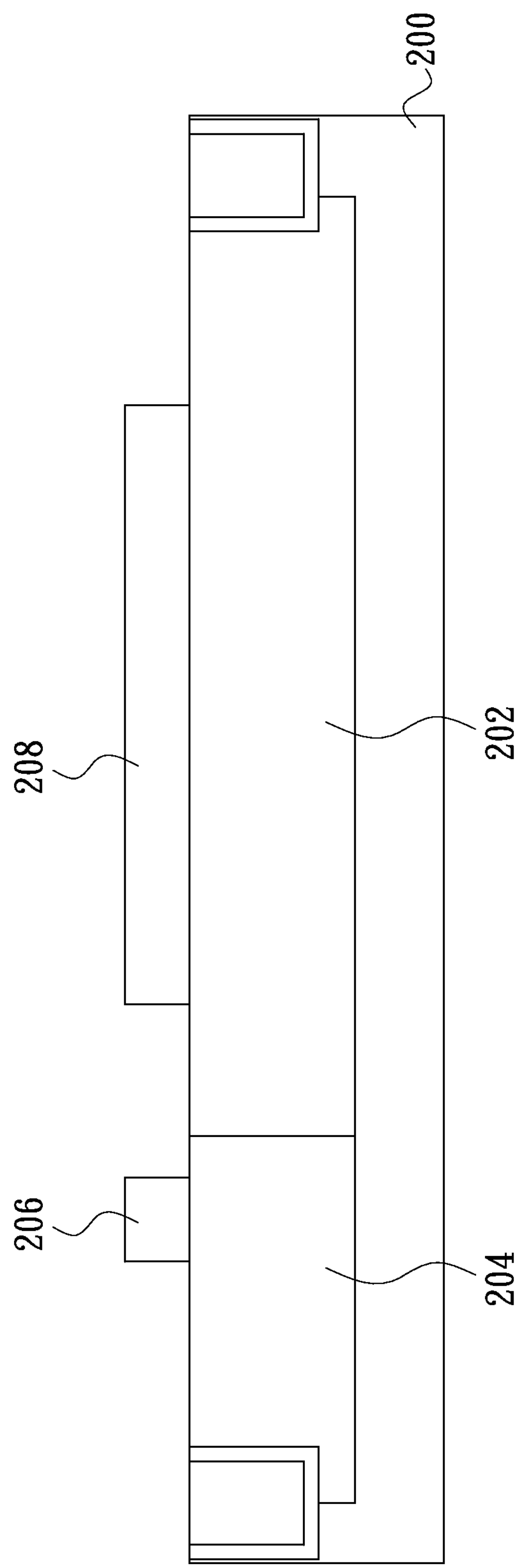
Figure 8C:
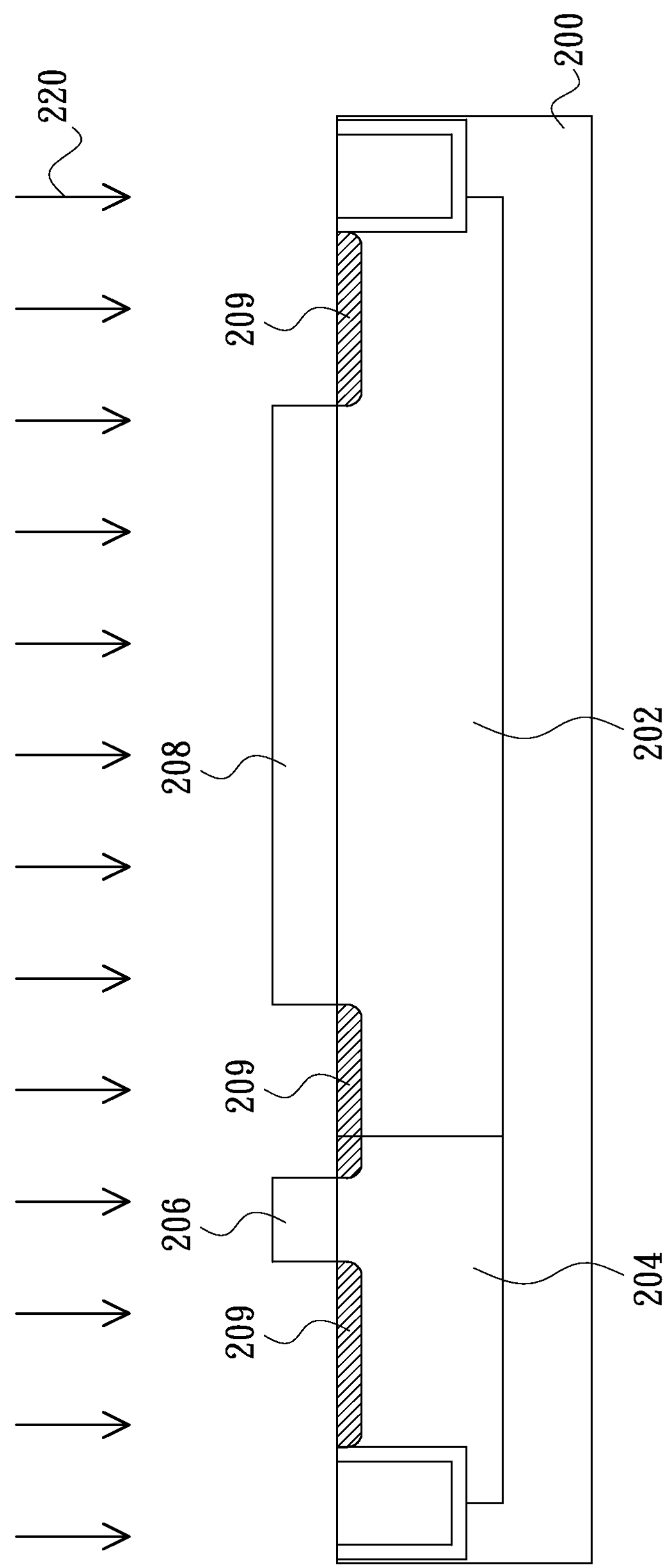
Figure 8D:
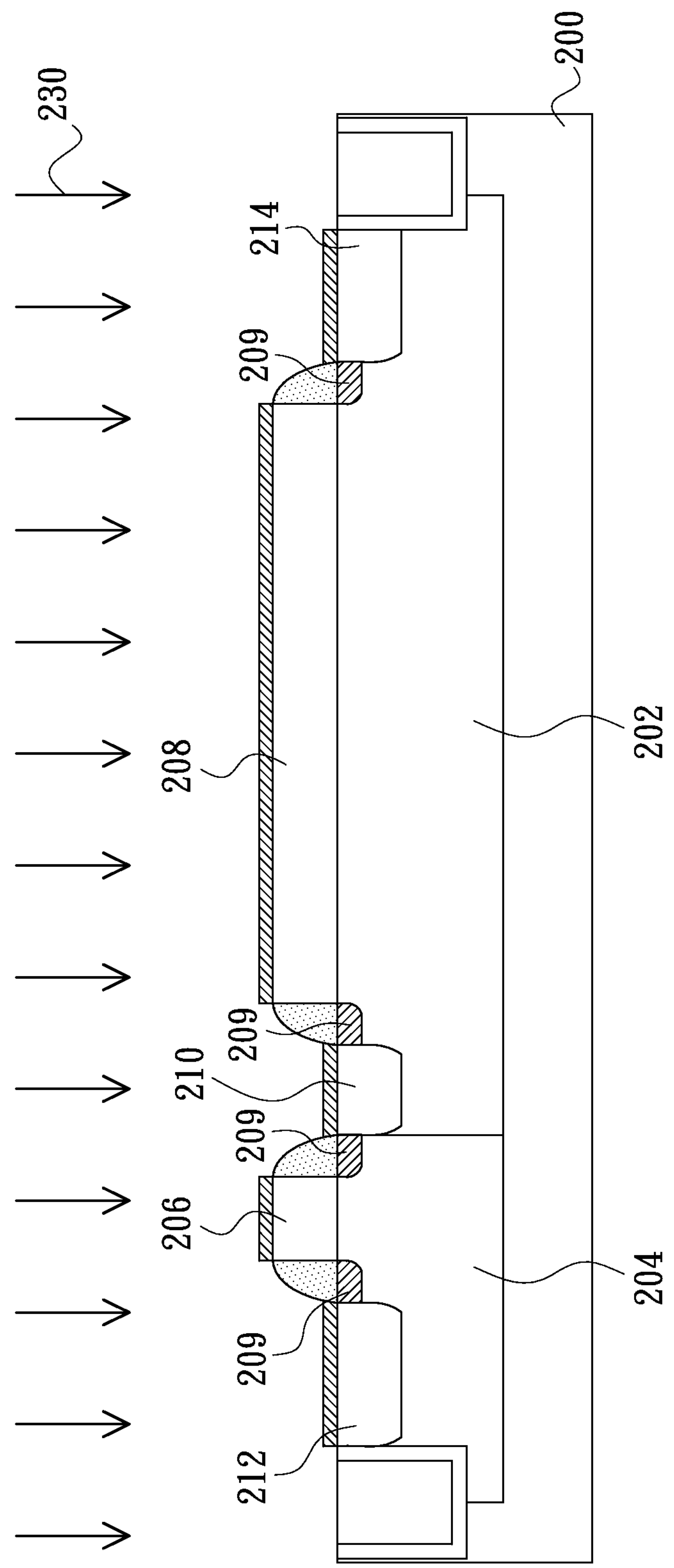

A method for fabricating a radio frequency device in accordance with an embodiment of the present invention will be described below in detailed. FIGS. 8A through 8D shows flow charts of the method for fabricating a radio frequency device. Referring to FIG. 8A firstly, a substrate 200 is provided. The substrate 200 includes a well of first type 202 and a well of second type 204. The well of first type 202 is adjacent to the well of second type 204. Subsequently, referring to FIG. 8B, a dummy gate of first type 208 is formed over the well of first type 202, and a gate of first type 206 is formed over the well of second type 204. Then, referring to FIG. 8C, an ion implantation process 220 is performed using the gate of first type 206 and the dummy gate of first type 208 as a mast to form a plurality of LDD structures 209 in the substrate 200. The LDD structures 209 are formed at two sides of the gate of first type 206 and the dummy gate of first type 208 respectively. After that, referring to FIG. 8D, another ion implantation process 230 is performed to form a drain region of first type 214 in the well of first type 202 and adjacent to the dummy gate of first type 208, to form a source region of first type 212 in the well of second type 204 and adjacent to the gate of first type 206, and to form a doped region of first type 210 in the well of first type 202 and adjacent to the well of second type 204. The doped region of first type 210 is formed between the gate of first type 206 and the dummy gate of first type 208.

In one embodiment, prior to performing the ion implantation process 230, spacers may be formed on the sidewalls of the gate of first type 206 and the dummy gate of first type 208. Then a dielectric layer is formed over the substrate 200 and the gate of first type 206 and the dummy gate of first type 208. The first type for example is n-type, and the second type for example is p-type. Moreover, a width of the doped region of first type 210 for example is greater than 160 nm, and a width of the dummy gate of first type 208 for example is greater than 90 nm.

Figure 9A:
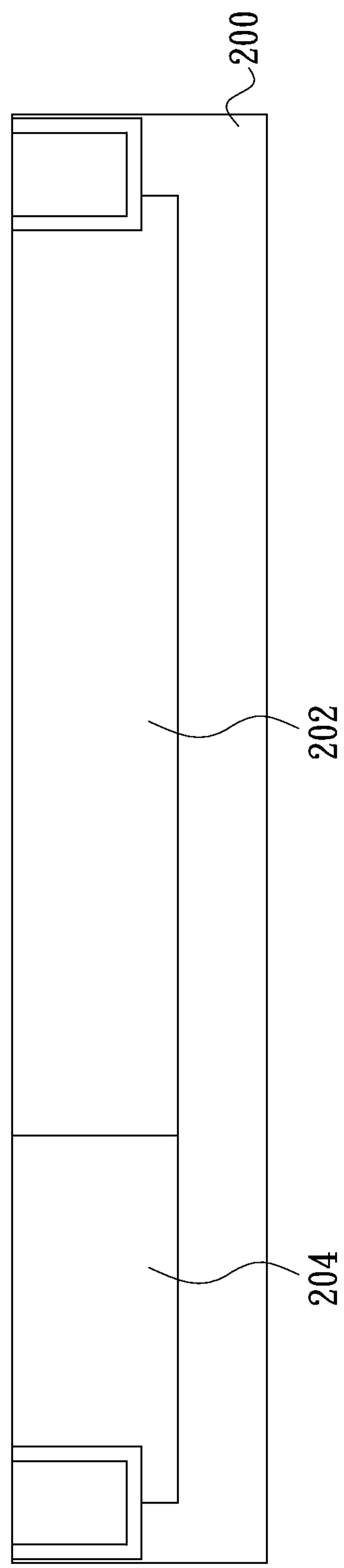
FIGS. 9A-9D are flowcharts of a method for fabricating a radio frequency device in accordance with another embodiment of the present invention.
Figure 9B:
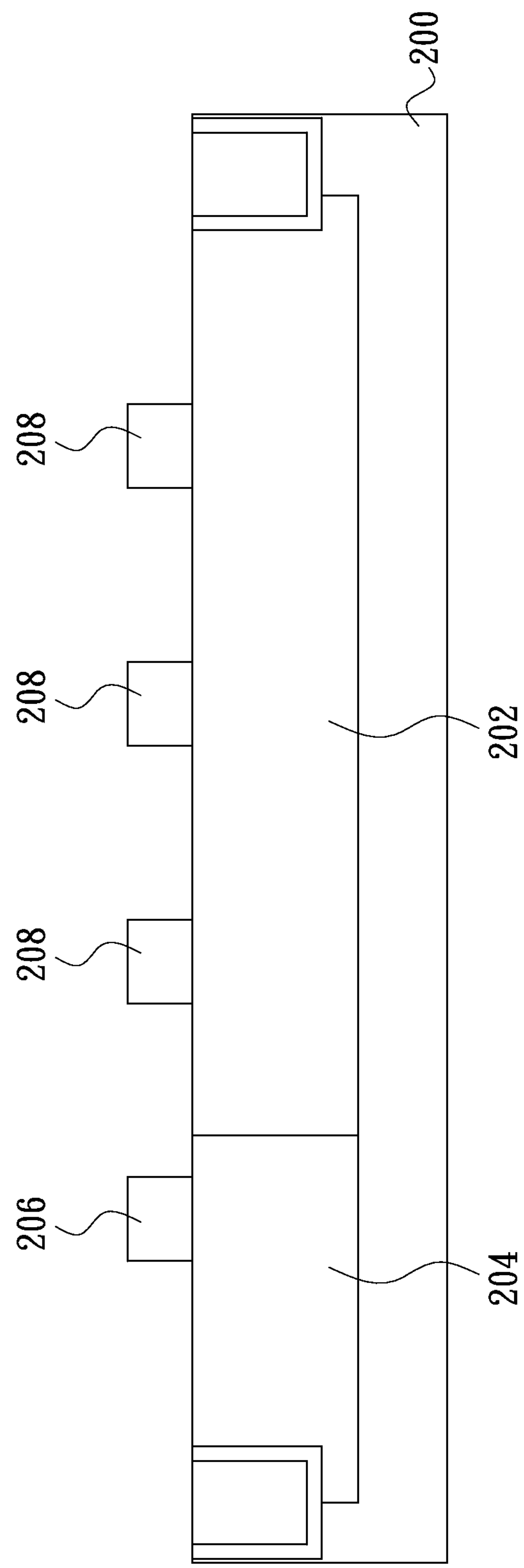
Figure 9C:
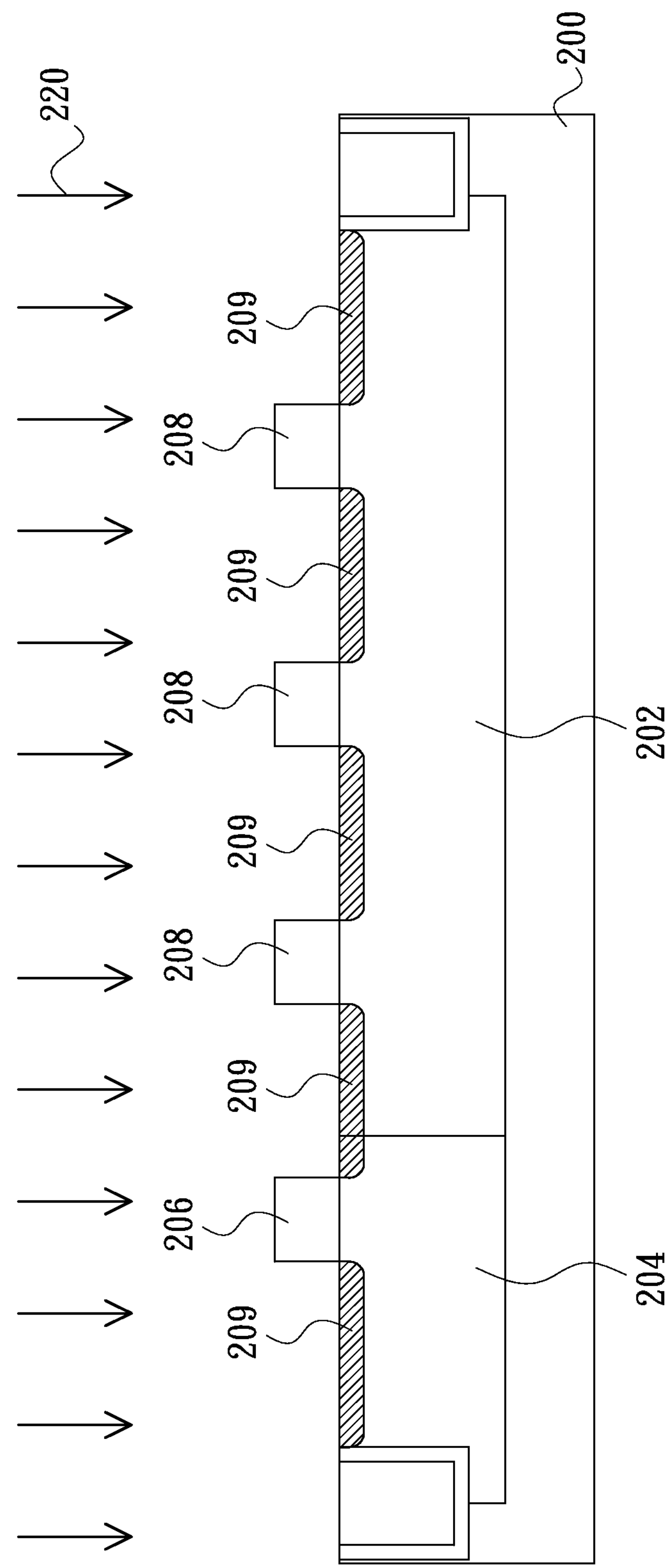
Figure 9D:
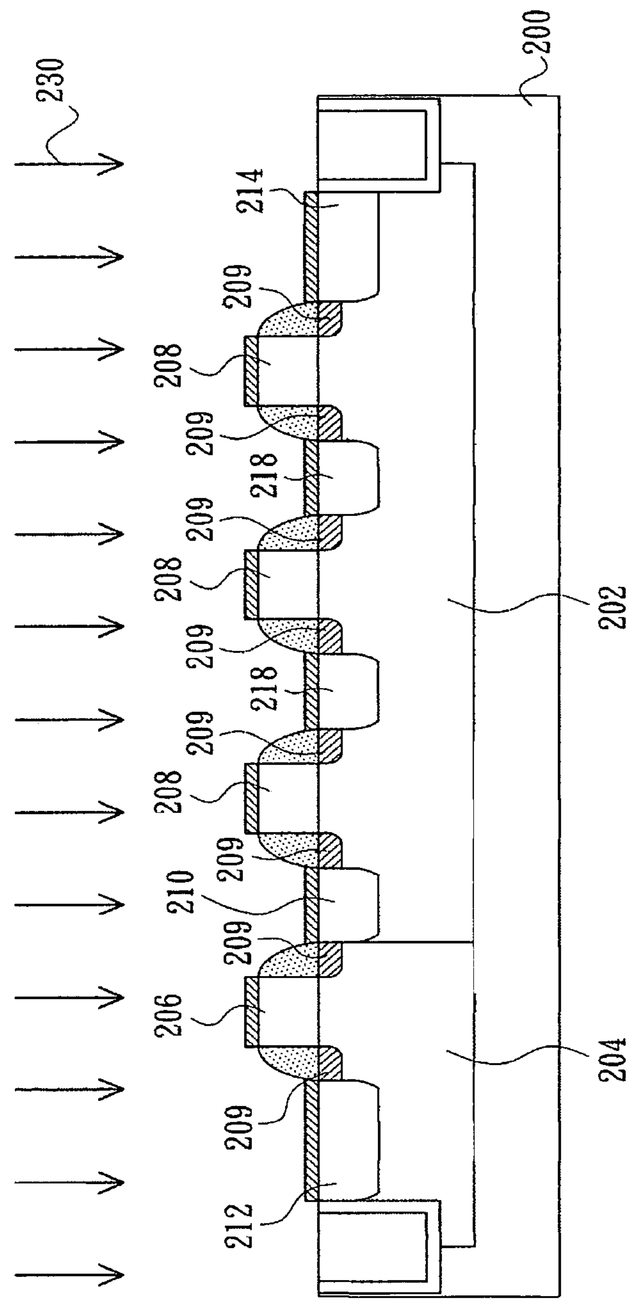

A method for fabricating a radio frequency device in accordance with another embodiment will be described below in detailed. FIGS. 9A through 9D shows flow charts of the method for fabricating a radio frequency device. Referring to FIG. 9A firstly, a substrate 200 is provided. The substrate 200 includes a well of first type 202 and a well of second type 204. The well of first type 202 is adjacent to the well of second type 204. Next, referring to FIG. 9B, a plurality of dummy gates 208 are formed over the well of first type 202, and a gate of first type 206 is formed over the well of second type 204. Then, referring to FIG. 9C, an ion implantation process 220 is performed using the gate of first type 206 and the dummy gates 208 as a mask to form LDD structures 209 in the substrate 200. The LDD structures 209 are formed at two sides of the gate of first type 206 and the dummy gates 208 respectively. After that, referring to FIG. 9D, another ion implantation process 230 is performed to form a drain region of first type 214 in the doped well of first type 202 and adjacent to the dummy gates 208, to form a source region of first type 212 in the well of second type 204 and adjacent to the gate of first type 206, and to form doped regions 210, 218 in the well of first type 202 and adjacent to the well of second type 204. The doped region 210 is formed in the well of first type 202 and adjacent to the well 204 of second type. The doped regions 218 are formed in the well of first type 202 and between the respective dummy gates 208.

In one embodiment, prior to performing the ion implantation process 230, spacers may be formed on the sidewalls of the gate of first type 206 and the dummy gates 208. Then, a dielectric layer is formed over the substrate 200, the gate of first type 206 and the dummy gates 208. The first type for example is n-type, and the second type for example is p-type. Moreover, a width of the doped region 210 for example is greater than 160 nm, and a width of each of the dummy gates 208 for example is greater than 90 nm.

In addition, in the respective above-mentioned embodiments of the present invention, the dummy gate(s) is/are simultaneously formed together with the gate during the same process. A material of the dummy gate(s) can be poly-silicon or metal, but not limited to these samples. The process for fabricating the dummy gate(s) can be chemical vapor deposition, metal sputtering, electroplating or other suitable process.

Moreover, in the respective above-mentioned embodiments of the present invention, the radio frequency device can be n-type metal-oxide-semiconductor (MOS) device or p-type MOS device. When the radio frequency device is an n-type MOS device, the first type is n-type, and the second type is p-type. Whereas, when the radio device is a p-type MOS device, the first type is p-type, and the second type is n-type.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A radio frequency device, comprising:

a substrate comprising a well of first type and a well of second type adjacent to the well of first type;

a dummy gate of first type formed over the well of first type;

a gate of first type formed over the well of second type;

a drain region of first type formed in the well of first type and adjacent to the dummy gate of first type;

a source region of first type formed in the well of second type and adjacent to the gate of first type; and a doped region of first type formed only in the well of first type and adjacent to the well of second type, wherein the doped region of first type is not directly above the well of second type.

2. The radio frequency device as claimed in claim 1, wherein the doped region of first type is formed between the gate of first type and the dummy gate of first type.

3. The radio frequency device as claimed in claim 1, wherein the first type is an n-type and the second type is a p-type.

4. The radio frequency device as claimed in claim 1, further comprising LDD structures formed in the substrate at two sides of the gate of first type and the dummy gate of first type respectively.

5. The radio frequency device as claimed in claim 1, wherein a width of the doped region of first type is greater than 160 nm.

6. The radio frequency device as claimed in claim 1, wherein a width of the dummy gate of first type is greater than 90 nm.

7. A radio frequency device, comprising:

a substrate comprising a well of first type and a well of second type adjacent to the well of first type;

a plurality of dummy gates formed over the well of first type;

a gate of first type formed over the well of second type;

a drain region of first type formed in the well of first type and adjacent to one of the dummy gates far away from the gate of first type; and a source region of first type formed in the well of second type and adjacent to the gate of first type.

8. The radio frequency device as claimed in claim 7, further comprising:

a plurality of doped regions formed in the well of first type and between the source region of first type and the drain region of first type.

9. The radio frequency device as claimed in claim 8, wherein the doped regions are formed at two sides of the dummy gates.

10. The radio frequency device as claimed in claim 8, wherein the doped regions are n-type, p-type or combinations thereof.

11. The radio frequency device as claimed in claim 7, wherein the dummy gates are n-type, p-type or combinations thereof.

12. The radio frequency device as claimed in claim 7, wherein the first type is an n-type and the second type is a p-type.

13. The radio frequency device as claimed in claim 7, further comprising LDD structures formed in the substrate at two sides of the gate of first type and the dummy gates respectively.

14. The radio frequency device as claimed in claim 8, wherein a width of each of the doped regions is greater than 160 nm.

15. The radio frequency device as claimed in claim 7, wherein a width of each of the dummy gates is greater than 90 nm.

16. A method for fabricating a radio frequency device, comprising:

providing a substrate comprising a well of first type and a well of second type adjacent to the well of first type;

forming a dummy gate of first type over the well of first type, and a gate of first type over the well of second type;

performing a first ion implantation process using the gate of first type and the dummy gate of first type as a mask to form LDD structures in the substrate at two sides of the gate of first type and the dummy gate of first type respectively; and performing a second ion implantation process to form a drain region of first type in the well of first type and adjacent to the dummy gate of first type, a source region of first type in the well of second type and adjacent to the gate of first type, and a doped region of first type only in the well of first type and adjacent to the well of second type, wherein the doped region of first type is not directly above the well of second type.

17. The method for fabricating a radio frequency device as claimed in claim 16, wherein the doped region of first type is formed between the gate of first type and the dummy gate of first type.

18. A method for fabricating a radio frequency device, comprising:

providing a substrate comprising a well of first type and a well of second type adjacent to the well of first type;

forming a plurality of dummy gates over the well of first type, and a gate of first type over the well of second type;

performing a first ion implantation process using the gate of first type and the dummy gates as a mask to form LDD structures in the substrate at two sides of the gate of first type and the dummy gates respectively; and performing a second ion implantation process to form a drain region of first type in the well of first type and adjacent to one of the dummy gates far away from the gate of first type, a source region of first type in the well of second type and adjacent to the gate of first type, and a plurality of doped regions in the well of first type and between the source region of first type and the drain region of first type.

19. The method for fabricating a radio frequency device as claimed in claim 18, wherein the doped regions are formed at two sides of the respective dummy gates.

* * * * *